United States Patent
Aggarwal et al.

(10) Patent No.: US 9,699,556 B2
(45) Date of Patent: Jul. 4, 2017

(54) ENHANCING AUDIO USING A MOBILE DEVICE

(71) Applicant: Caavo Inc, Santa Clara, CA (US)

(72) Inventors: Ashish Dharmpal Aggarwal, Stevenson Ranch, CA (US); Sharath Hariharpur Satheesh, Bangalore (IN)

(73) Assignee: Caavo Inc, Santa Clara, CA (US)

( * ) Notice: Subject to any disclaimer, the term of this patent is extended or adjusted under 35 U.S.C. 154(b) by 0 days.

(21) Appl. No.: 15/157,131

(22) Filed: May 17, 2016

(65) Prior Publication Data

US 2016/0259621 A1 Sep. 8, 2016

Related U.S. Application Data

(62) Division of application No. 14/449,159, filed on Aug. 1, 2014, now Pat. No. 9,565,497.

(Continued)

(51) Int. Cl.
*H04R 3/00* (2006.01)
*H04R 3/04* (2006.01)
(Continued)

(52) U.S. Cl.
CPC .............. *H04R 3/04* (2013.01); *G06F 3/165* (2013.01); *G10L 21/0232* (2013.01); *G10L 25/51* (2013.01); *H03G 3/20* (2013.01); *H03G 3/3005* (2013.01); *H03G 3/32* (2013.01); *H03G 5/005* (2013.01); *H03G 5/165* (2013.01);
(Continued)

(58) Field of Classification Search
CPC ..... G06F 3/165; G10L 21/0232; G10L 25/51; G10K 11/16; H03G 3/20; H03G 3/3005; H03G 3/32; H03G 5/005; H03G 5/165; H03G 7/002; H03H 17/04; H03H 2017/0472; H04R 1/08; H04R 1/20; H04R 1/22; H04R 1/222; H04R 1/225; H04R 1/227; H04R 2420/07; H04R 2430/01; H04R 2430/20; H04R 2499/10; H04R 2499/11; H04R 2499/15; H04R 25/50; H04R 25/505; H04R 29/00; H04R 29/001;
(Continued)

(56) References Cited

U.S. PATENT DOCUMENTS 2,458,641 A 1/1949 Rettinger et al.
4,758,908 A * 7/1988 James .................... G11B 19/02
360/13

(Continued)

*Primary Examiner* — Khai N Nguyen
(74) *Attorney, Agent, or Firm* — Fiala & Weaver P.L.L.C.

(57) ABSTRACT

Embodiments disclosed herein enable detection and improvement of the quality of the audio signal using a mobile device by determining the loss in the audio signal and enhancing audio by streaming the remainder portion of audio. Embodiments disclosed herein enable an improvement in the sound quality rendered by rendering devices by emitting an test audio signal from the source device, measuring the test audio signal using microphones, detecting variation in the frequency response, loudness and timing characteristics using impulse responses and correcting for them. Embodiments disclosed herein also compensate for the noise in the acoustic space by determining the reverberation and ambient noise levels and their frequency characteristics and changing the digital filters and volumes of the source signal to compensate for the varying noise levels.

20 Claims, 16 Drawing Sheets

Related U.S. Application Data

(60) Provisional application No. 61/861,138, filed on Aug. 1, 2013.

(51) Int. Cl.

| | | |
|---|---|---|
| *H03G 3/20* | (2006.01) | |
| *H03G 5/16* | (2006.01) | |
| *H04R 25/00* | (2006.01) | |
| *G06F 3/16* | (2006.01) | |
| *G10L 25/51* | (2013.01) | |
| *H03G 3/30* | (2006.01) | |
| *G10L 21/0232* | (2013.01) | |
| *H03G 7/00* | (2006.01) | |
| *H03H 17/04* | (2006.01) | |
| *H04R 1/08* | (2006.01) | |
| *H03G 3/32* | (2006.01) | |
| *H03G 5/00* | (2006.01) | |
| *H04R 29/00* | (2006.01) | |

(52) U.S. Cl.
CPC ............ *H03G 7/002* (2013.01); *H03H 17/04* (2013.01); *H04R 1/08* (2013.01); *H04R 3/00* (2013.01); *H04R 25/50* (2013.01); *H04R 25/505* (2013.01); *H04R 29/00* (2013.01); *H04R 29/004* (2013.01); *H03H 2017/0472* (2013.01); *H04R 29/001* (2013.01); *H04R 2430/01* (2013.01); *H04R 2499/11* (2013.01)

(58) Field of Classification Search
CPC ........ H04R 29/004; H04R 3/00; H04R 3/002; H04R 3/04; H04R 5/04
USPC .................... 381/94.1, 94.2, 95, 96, 99, 103
See application file for complete search history.

(56) References Cited

U.S. PATENT DOCUMENTS

| | | | |
|---|---|---|---|
| 4,888,808 A | 12/1989 | Ishikawa et al. | |
| 7,593,535 B2 | 9/2009 | Shmunk | |
| 8,300,837 B2 | 10/2012 | Shmunk | |
| 8,588,431 B2 | 11/2013 | Aggarwal et al. | |
| 8,682,002 B2 | 3/2014 | Wihardja et al. | |
| 8,688,249 B2* | 4/2014 | Vernon .................. | H04R 29/00 381/61 |
| 8,898,568 B2* | 11/2014 | Bull ........................ | G06F 3/167 381/61 |
| 2003/0169891 A1 | 9/2003 | Ryan et al. | |
| 2004/0240676 A1* | 12/2004 | Hashimoto .............. | H04R 5/02 381/56 |
| 2005/0175190 A1* | 8/2005 | Tashev ................... | H04R 3/005 381/92 |
| 2006/0098827 A1* | 5/2006 | Paddock ................. | G10L 21/02 381/106 |
| 2008/0031471 A1 | 2/2008 | Haulick et al. | |
| 2008/0037804 A1 | 2/2008 | Shmunk | |
| 2008/0226098 A1* | 9/2008 | Haulick .............. | G10L 21/0208 381/94.9 |
| 2008/0285775 A1* | 11/2008 | Christoph ................ | H03G 3/32 381/99 |
| 2010/0054519 A1* | 3/2010 | Mulvey .................. | G06F 1/1632 381/386 |
| 2010/0061563 A1 | 3/2010 | Gelhard et al. | |
| 2010/0064218 A1* | 3/2010 | Bull ........................ | G06F 3/167 715/716 |
| 2010/0272270 A1* | 10/2010 | Chaikin ................ | H04R 29/008 381/59 |
| 2011/0002471 A1 | 1/2011 | Wihardja et al. | |
| 2011/0064258 A1* | 3/2011 | Aggarwal ............... | H04S 7/302 381/394 |
| 2011/0116642 A1* | 5/2011 | Hall ....................... | H04H 60/04 381/58 |
| 2012/0106749 A1 | 5/2012 | Buck et al. | |
| 2012/0140936 A1* | 6/2012 | Bonnick .................. | H04R 3/04 381/59 |
| 2012/0250900 A1* | 10/2012 | Sakai ...................... | H04R 3/04 381/122 |
| 2013/0066453 A1* | 3/2013 | Seefeldt .................. | H04S 7/301 700/94 |
| 2013/0070928 A1* | 3/2013 | Ellis ....................... | H04R 25/30 381/56 |
| 2013/0243227 A1 | 9/2013 | Kinsbergen et al. | |
| 2014/0003625 A1* | 1/2014 | Sheen ...................... | H03G 5/005 381/103 |
| 2014/0064521 A1 | 3/2014 | Aggrawal | |
| 2014/0142958 A1* | 5/2014 | Sharma ................. | G10L 19/018 704/500 |
| 2015/0156588 A1* | 6/2015 | Kyriakakis ............... | H04R 3/04 381/98 |
| 2015/0189457 A1* | 7/2015 | Donaldson .............. | H04S 7/303 381/1 |
| 2015/0223004 A1* | 8/2015 | Deprez ................... | H04S 7/301 381/303 |
| 2015/0304791 A1* | 10/2015 | Crockett .................. | H04R 1/26 381/307 |
| 2015/0372761 A1 | 12/2015 | Boutaud | |
| 2015/0378666 A1* | 12/2015 | Vandeweerd .......... | G05B 15/02 700/94 |
| 2016/0035337 A1 | 2/2016 | Aggarwal et al. | |
| 2016/0261247 A1 | 9/2016 | Aggarwal et al. | |
| 2016/0261953 A1 | 9/2016 | Aggarwal et al. | |

\* cited by examiner

ENHANCING AUDIO USING A MOBILE DEVICE

CROSS REFERENCE TO RELATED APPLICATION

This application is a divisional application of U.S. patent application Ser. No. 14/449,159, filed on Aug. 1, 2014, which claims priority to U.S. Provisional Application No. 61/861,138 filed on Aug. 1, 2013, the entireties of which are incorporated herein.

BACKGROUND

Technical Field

The embodiments herein relate to enhancing audio rendered by at least one rendering device and, more particularly, to enhancing audio rendered by at least one rendering device using a mobile device.

Description of Related Art

Currently, a user may have access to audio data (such as an audio file, a video file with an audio track and so on) in a plurality of places such as his residence, office, vehicle and so on. The user may also use a plurality of devices to access the audio data such as his mobile phone, tablet, television, computer, laptop, wearable computing devices, CD (Compact Disc) player and so on.

To listen to the audio, the user may use external systems (such as a home theater system, car speakers/tweeters/amplifiers and so on) or internal systems (such as speakers inbuilt to the device playing the audio) and so on. There may be a plurality of issues faced by the user, when listening to the audio.

The audio data may be of poor quality. For example, audio electronic storage files (such as MP3 and so on) may have poor quality. In another example, the audio data received over the Internet may be of poor quality (which may be caused by poor quality of the audio file available on the internet, a poor internet connection and so on). This case may be considered where the audio 'signal' is of poor quality.

The devices, which render the audio to the user, may be of poor quality. Furthermore, the acoustic space in which the device is placed affects the quality of these devices. These devices, which render the audio, may be built using various different components that are not matched to each other, resulting in loss of audio quality.

Also, ambient noise (such as traffic noise in a car) may result in a loss in the audio quality audible to the user. The ambient noise level of the acoustic space may also vary over time. For example, depending of the speed or the type of the road, the ambient noise in a car may vary.

BRIEF DESCRIPTION OF THE DRAWINGS/FIGURES

The embodiments herein will be better understood from the following detailed description with reference to the drawings, in which.

DETAILED DESCRIPTION

Figure 1:
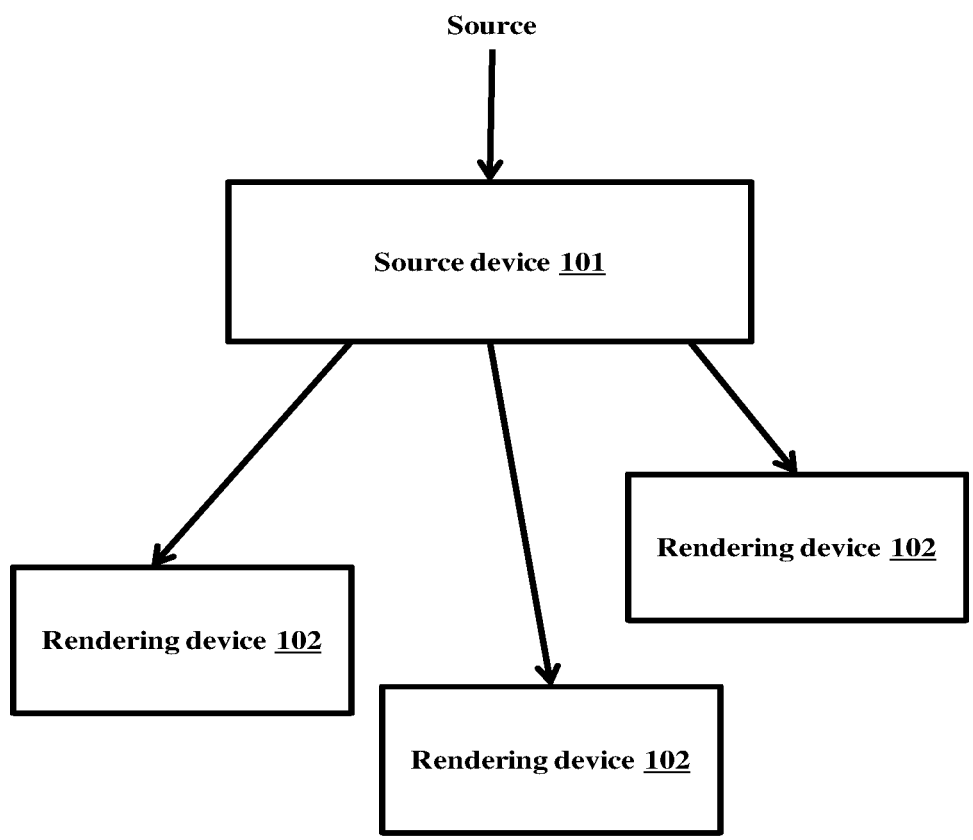
FIG. 1 depicts a system comprising of a source device and at least one rendering device, according to embodiments as disclosed herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein disclose a method and system for enhancing audio quality using a mobile device. Referring now to the drawings, and more particularly to FIGS. 1 through 10, where similar reference characters denote corresponding features consistently throughout the figures, there are shown embodiments.

Embodiments herein disclose a method and system for improving the overall quality of audio for a user by detecting a plurality of quality parameters. Using the measured quality parameters, the audio signal is processed in a manner such that the sound quality output is improved. The quality parameters that may be calculated are as follows: source signal quality (this parameter determined how good the source signal is compared to a similar very high-quality audio signal), calibration of the rendering device (parameters are calculated based on a calibration signal which may be used to determine overall quality of a rendering device and based on the quality of the rendering device, a digital signal processing algorithm is designed that does equalization, loudness correction and timing synchronization of the rendering devices) and acoustic quality of the space in which the rendering device is operating (this determines the noise level and characteristics in an acoustic space).

FIG. 1 depicts a system comprising of a source device and at least one rendering device, according to embodiments as disclosed herein. The system comprises of a source device 101 and at least one rendering device 102. The source device 101 may be a device configured to read audio data. The audio data may be an audio file, a video file with an audio clip (such as a movie, television series, documentaries and so on), a video game and so on. The source device 101 may be a mobile phone, a tablet, a television, a CD player, a DVD player, a Blu-ray player, a laptop, a computer and so on. The source device 101 may further comprise of a means to display visual data such as a display, monitor and so on. The source device 101 may access the audio data by reading the audio data from a data storage means such as a CD, DVD, Blu-Ray, flash drive, internal storage or any other form of storage, which may contain audio data. The source device 101 may stream the audio data from a network location such as the Internet, a LAN (Local Area Network), a WAN (Wide Area Network) and so on.

The rendering device 102 may be a device, which enables the audio data to be made audible to a user. The rendering device 102 may be a speaker, an amplifier, a tweeter, a headphone, a headset and so on. The rendering device 102 may be inbuilt with the source device 101. The rendering device 102 may be located remotely from the source device 101 and may communicate with the source device 101 using a suitable means such as a wired means, wireless means (Bluetooth, Wi-Fi and so on). There may be at least one rendering device connected to the source device 101.

Figure 2:
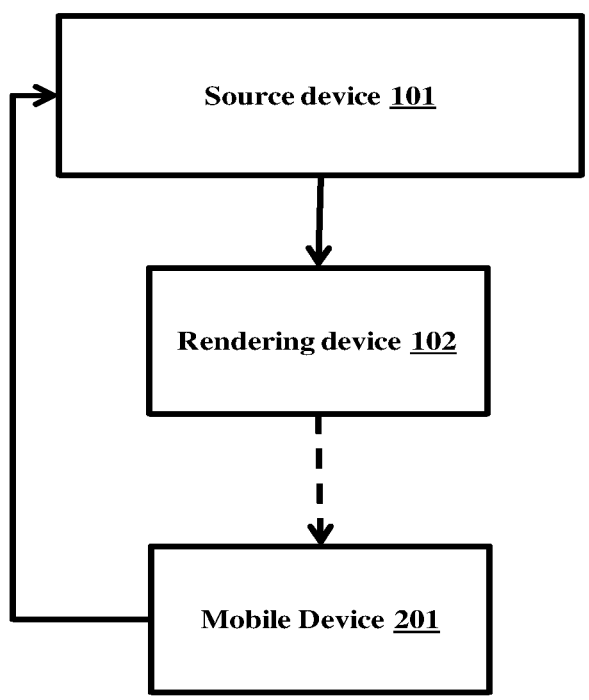
FIG. 2 depicts a mobile device being used to enhance audio data from a system comprising of a source device and at least one rendering device, according to embodiments as disclosed herein.

FIG. 2 depicts a mobile device being used to enhance audio data from a system comprising of a source device and at least one rendering device, according to embodiments as disclosed herein. The source device 101 and the at least one rendering device 102 are connected to each other. The space where the audio data from the source device 101 and the rendering device 102 is audible is hereinafter referred to as an acoustic space. The mobile device 201 may be connected to the source device 101 through a suitable communication means such as a wired means, wireless means and so on. The mobile device 101 may be configured to receive audio data from the rendering device 102 through a suitable means such as a microphone and so on. The mobile device 201 may be a mobile phone, a tablet, a computer, a laptop or any other device capable of receiving audio data and perform analysis on audio data.

Figure 3A:
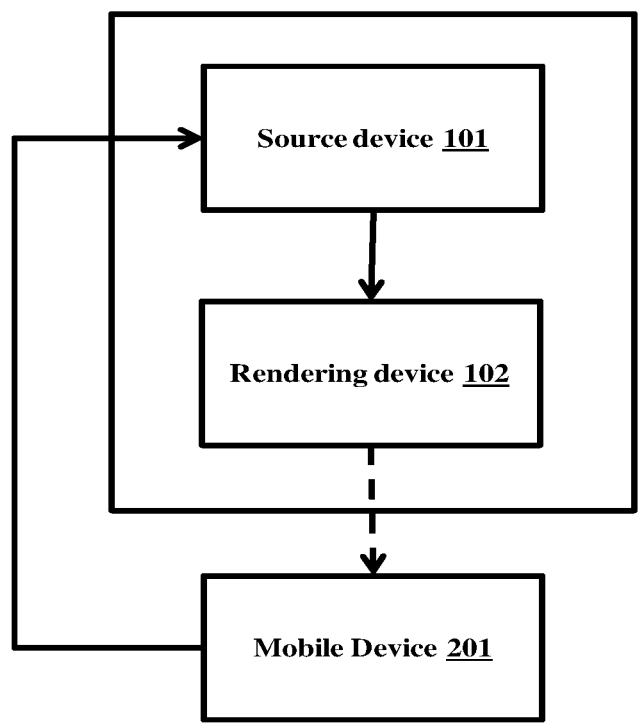
FIGS. 3a, 3b, 3c, 3d, 3e and 3f depict illustrations where the mobile device is located with respect to the source device and the rendering device, according to embodiments as disclosed herein.
Figure 3B:
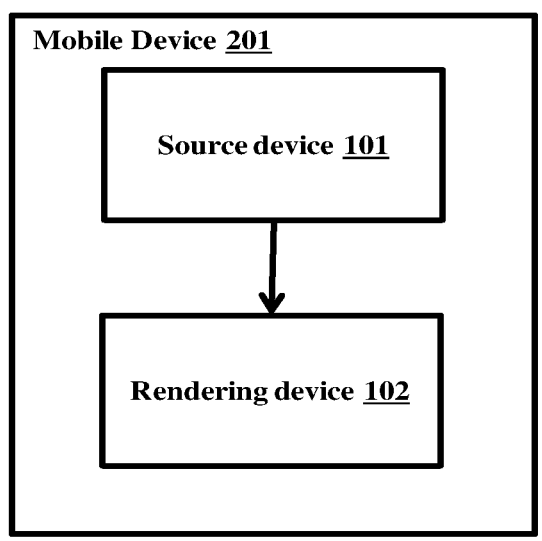
Figure 3C:
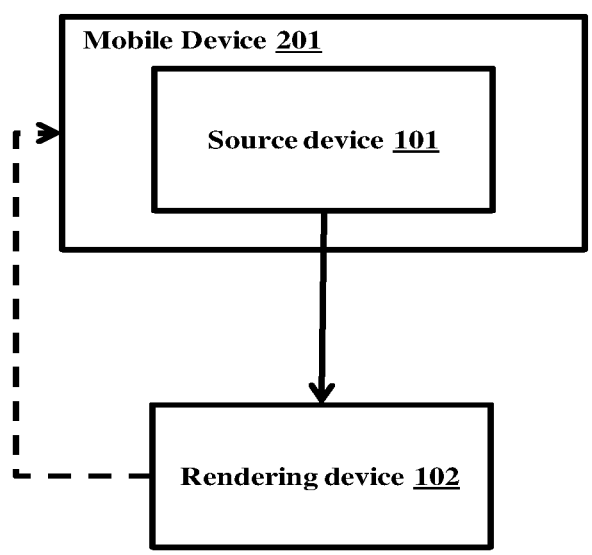
Figure 3D:
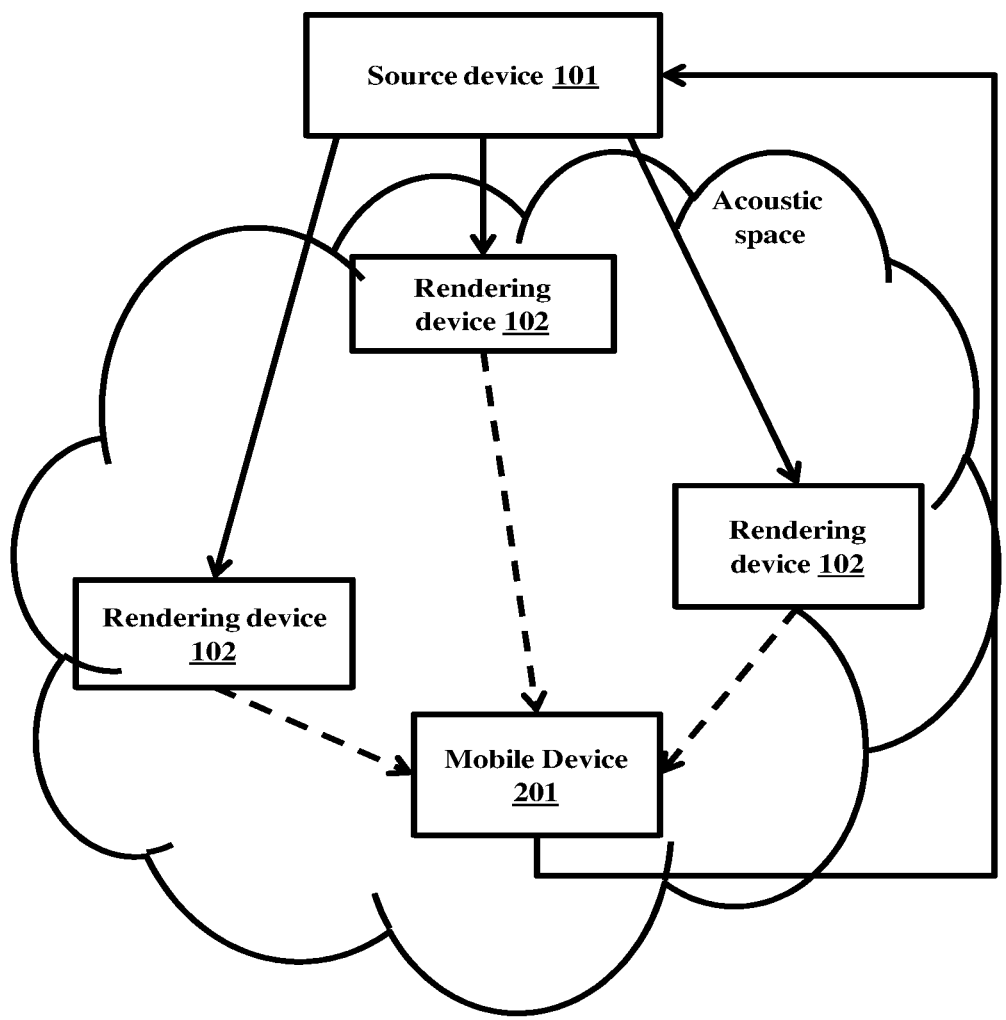
Figure 3E:
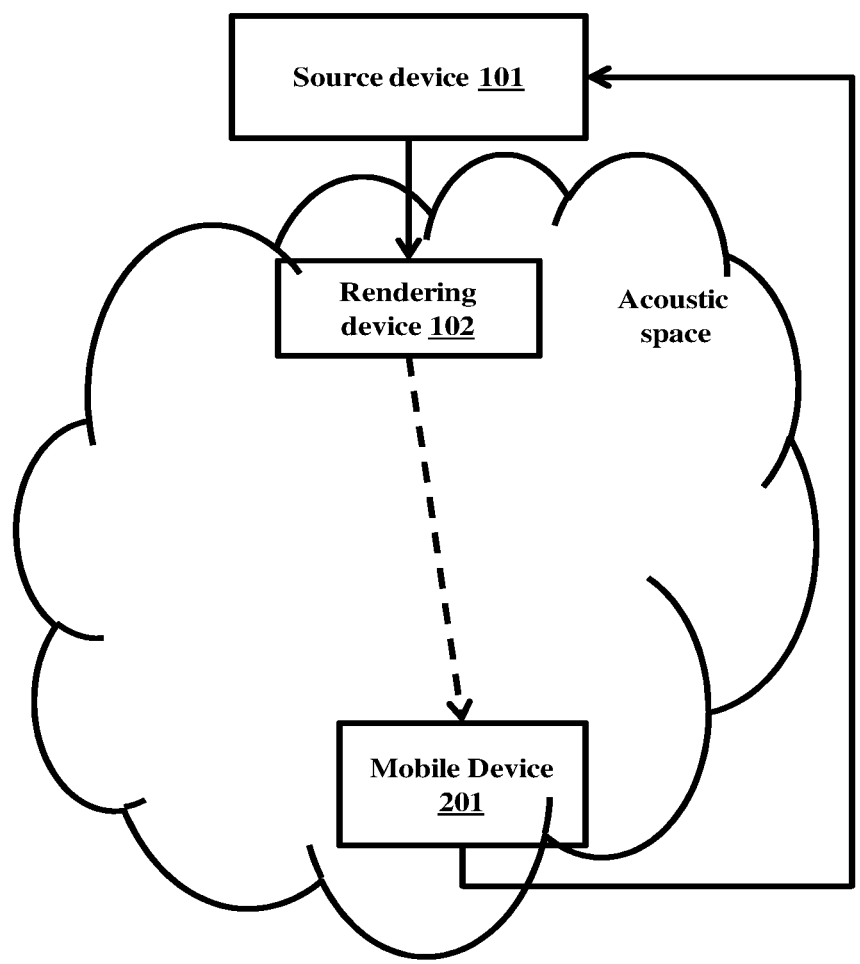
Figure 3F:
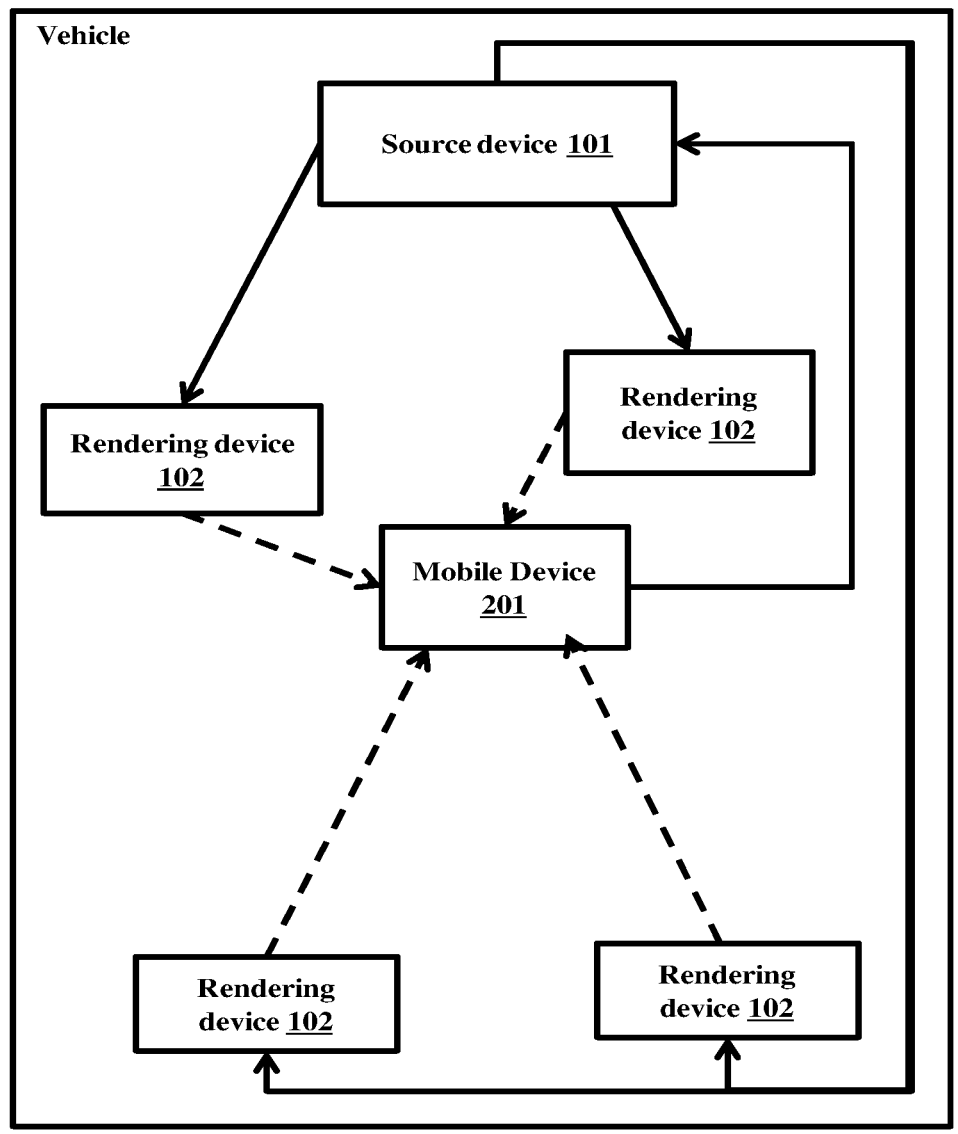

The source device 101 and the rendering device 102 may be present within the same device and connected to the mobile device 201 using a suitable connection means (as depicted in FIG. 3a). The source device 101 and the rendering device 102 may be located within the mobile device 201 (as depicted in FIG. 3b). The source device 101 may be co-located with the mobile device 201, with the rendering device 102 located remotely from the mobile device 201 (as depicted in FIG. 3c). The source device 101 may be connected to a plurality of rendering devices 102, with the mobile device 201 being located within the acoustic space, wherein the acoustic space is an areas such as a room, a stage, a theater, an amphitheater, a stadium and so on (as depicted in FIGS. 3d and 3e). The source device 101, the rendering device 102 and the mobile device 201 may be co-located within a vehicle (as depicted in FIG. 3O.

The mobile device 201, on detecting audio being played, may obtain the frequency characteristics of the microphone of the mobile device 201. The mobile device 201 may determine the frequency characteristics using a stored profile of the mobile device 201 stored in a suitable location within the mobile device 201 or external to the mobile device 201. The mobile device 201 may further determine the quality of the source signal and improve the quality of the source signal. The mobile device 201 may then perform calibration of the rendering devices 102. The calibration may be in terms of modifying equalization settings. The mobile device 201 may further compensate for ambient noise. The mobile device 201 may communicate settings related to the calibration and the ambient noise compensation to the source device 101.

Figure 4:
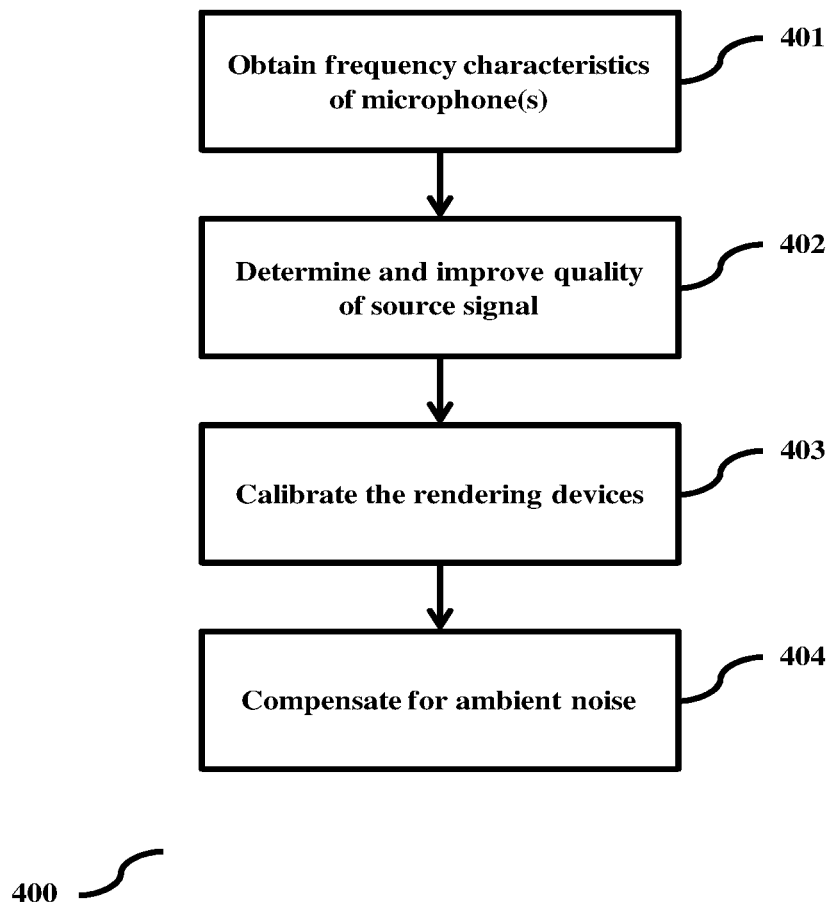
FIG. 4 is a flowchart illustrating the process of enhancing audio data, according to embodiments as disclosed herein.

FIG. 4 is a flowchart illustrating the process of enhancing audio data, according to embodiments as disclosed herein. The mobile device 201, on detecting audio being played, obtains (401) the frequency characteristics of the microphone of the mobile device 201. The mobile device 201 may determine the frequency characteristics using a stored profile of the mobile device 201 stored in a suitable location within the mobile device 201 or external to the mobile device 201. The mobile device 201 may calculate the frequency characteristics of the mobile device 201. The mobile device 201 further determines (402) the quality of the source signal and improves the quality of the source signal. The mobile device 201 then calibrates (403) the rendering devices 102. The calibration may be in terms of modifying equalization settings. The mobile device 201 further compensates (404) for ambient noise. The mobile device 201 communicates the improved source signal, settings related to the calibration and the ambient noise compensation to the source device 101. The various actions in method 400 may be performed in the order presented, in a different order or simultaneously. Further, in some embodiments, some actions listed in FIG. 4 may be omitted.

Figure 5:
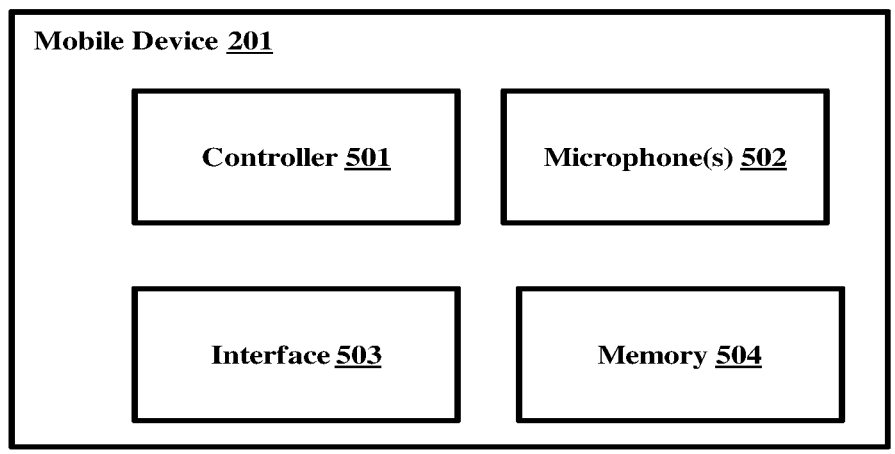
FIG. 5 depicts a mobile device, according to embodiments as disclosed herein.

FIG. 5 depicts a mobile device, according to embodiments as disclosed herein. The mobile device 201, as depicted, comprises of a controller 501, at least one microphone 502, a communication interface 503 and a memory 504.

The controller 501 may determine the frequency characteristics of the microphone 502. The controller 501 may fetch the frequency characteristics of the microphone 502 from the memory 504. The controller 501 may communicate a test audio signal to the source device 101, wherein the test audio signal may be a logarithmic test sweep signal. The source device 101 may play the test audio signal using the rendering device 102. The controller 501 may capture the test signal from the rendering device 102 using the microphone 502, wherein the mobile device 201 may be placed at a very close range to the rendering device 102. The controller 501 may guide the user through the above-mentioned steps. The controller 501 may then determine the impulse response of the captured test signal. The controller 501 may invert the frequency characteristics of the impulse response and may determine a microphone-equalizing filter, wherein the microphone-equalizing filter may be used to compensate for the frequency characteristics of the microphone 502. The controller 502 may store the microphone-equalizing filter in the memory 504 and may be used in the further steps.

The controller 501, on detecting that audio is being played though the microphone 502 may use the detected audio signal and a suitable audio fingerprinting means to identify the audio being played. On identifying the audio, the controller 501 may fetch a small portion of a high-quality version of the detected audio signal from a location (such as the internet, the LAN, the WAN, a dedicated server and so on). The controller 501 may time align the detected audio signal and the fetched audio signal. The controller 501 may perform the time alignment by comparing the detected audio signal and time shifted versions of the fetched audio signal. Once the signals are time aligned, the controller 501 may calculate a metric related to the difference between the high-quality fetched audio signal and the original source signal using the formula:

$$Sq=(H*H+O*O)/(H-O)*(H-O)$$

Where H is the fetched audio signal, O is the detected audio signal and Sq is the quality of the detected audio signal. The controller 501 may check if the source signal is of a low quality by comparing Sq with a quality threshold. If Sq is less than the threshold, then the controller 501 may determine that the source signal is of low quality. If the source signal is of low quality, the controller 501 may detect a high quality source of the sound signal from a suitable location (such as the Internet, a LAN, a WAN, a dedicated server and so on) and stream the high-quality signal from the suitable location. The controller 501 may transmit the difference signal between the low quality and high quality signal to the source device 101, which results in an improvement in the quality of the source signal.

The controller 501 may determine the setup of the rendering devices (number of rendering devices, locations of the rendering devices, types of rendering devices and so on). In an embodiment herein, the controller 501 may use the sensors of the mobile device 201 such as the magnetometer and accelerometer to measure angles with respect to the rendering devices. The magnetometer may provide the initial reference direction and the accelerometer may be used to give the angular displacement from the initial reference direction. The controller 501 may obtain the absolute angles of the locations of the rendering devices with respect to the reference position. The controller 501 may provide instructions to the user to point the mobile device 201 toward the rendering device and the controller 501 determines the Cartesian coordinates. In another embodiment herein, the controller 501 may prompt the user to input the coordinates of the rendering devices. In another embodiment herein, the controller 501 may use the microphones to triangulate and find the location of the rendering devices.

The controller 501 may determine the relative distances of the rendering devices by providing a known reference signal to the source device 101. The source device 101 may play the reference signal at periodic intervals (wherein the periodic intervals may be determined by the controller 501). The controller 501 may capture the reference signals played from the rendering devices using the microphone 502. The controller 501 may determine the relative distances of the rendering devices by calculating the delays.

The controller 501 may further check the acoustics of the acoustic space. The controller 501 may use impulse response (IR) method to find the frequency response, distance and loudness of the rendering devices and the acoustic space. The controller 501 may first send a test tone or a calibration audio signal, preferably an audio signal frequency sweep, to the rendering device (through the source device). The controller 501 may capture back the calibration signal using the microphone 502. The controller 501 may calculate an impulse response for the broadcast calibration audio signal. The controller may take the inverse Fourier transform (FFT) of the ratio of the FFT of the frequency sweep signal and FFT of the received microphone signal. This impulse response may represent the quality of the audio signal in the current acoustic space.

In one embodiment, the controller 501 may calculate a crossover filter using the impulse response, wherein the crossover filter may be applied to the rendering device 102. The cross-over filter may be a fourth order Butterworth filter, wherein the cut-off of the Butterworth filter may be determined by the controller 501 from the frequency response of the impulse response. In an embodiment herein, the controller 501 may consider the point at which the amplitude of the frequency response drops to −10 dB of the maximum amplitude over the entire frequency range as the cut-off frequency.

In another embodiment, the controller 501 may determine the loudness of the rendering device using the impulse response. The controller 501 may compute the loudness by calculating the energy of the impulse response. The controller 501 may use a well-known weighting filter, such as A-weights or C-weights for computation of this loudness in conjunction with the impulse response. After determining the loudness of the rendering device, the controller 501 may determine the loudness compensation by computing the average of the magnitude of all the frequency responses for the rendering device. The controller 501 may use the inverse of the average of the magnitude of all the frequency responses for the rendering device to match the volume of each subsequent rendering device (if any).

In one embodiment, the controller 501 may mimic the non-linear frequency scale of a human auditory system by passing the impulse response through a set of all-pass filters. This filtered signal is hereinafter referred to as 'm'. The controller 501 may compute a finite impulse response (FIR) filter (hereinafter referred to as w), which is the minimum phase filter whose magnitude response is the inverse of m. The controller 501 may invert the non-linear frequency scale to yield the final equalization filter by passing the FIR w through a set of all-pass filters, wherein the final equalization filter may be used to compensate the quality of rendering device. The controller 501 may repeat this process for all the rendering devices.

In an embodiment herein, the controller 501 may use an infinite impulse response (IIR) filter to correct the response of the rendering device. In an embodiment herein, the controller 501 may use a combination of FIR and IIR filters may be used to correct the response of the rendering device.

In order to synchronize multiple rendering devices in time, the controller 501 may calculate a delay compensation by first calculating the delay between broadcast of the calibration signal from each of the rendering devices and the corresponding receipt of such signal at the microphone, preferably through examination of the point at which the impulse repulse is at its maximum. The controller 501 may then obtain a delay compensation filter by subtracting the delay from a pre-determined maximum delay (which may be configured by the user at the source device 101). The controller 501 may estimate a delay filter for the subject-rendering device 102 for later compensation of any uneven timing of the previously determined impulse response.

The controller 501 may account for the different ambient noise levels during playback of the audio signal through the rendering devices. The controller 501 may use the microphone 502. On detecting a period of silence in the source signal, the controller 501 through the microphone 502, measure ambience noise characteristics. The ambient noise characteristics may comprise of frequency characteristics and loudness level of noise, during this period of silence. The controller 501 may measure loudness using a suitable method (such as A-weights) that can mimic human hearing. The controller 501 may calculate the frequency response using the FFT of the detected noise signal. The controller 501 uses the inverse of the frequency response to calculate a digital filter (wherein the digital filter may be at least one of FIR or IIR) to compensate for the noise characteristics. The controller 501 may also estimate an optimum volume level of the source signal, based on the loudness level of the noise so as to keep constant power between the noise and the source signal. The controller 501 may communicate the digital filter and the optimum noise level to the source device 101, which performs adjustments as per the received communication.

Figure 6:
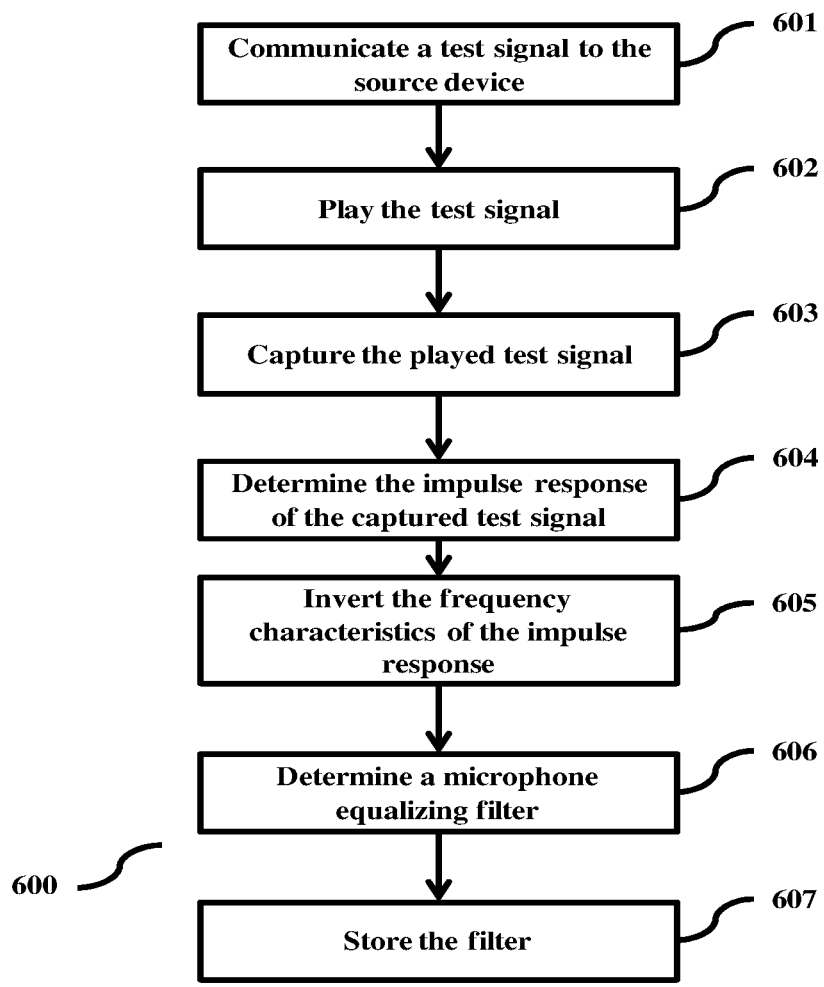
FIG. 6 is a flowchart illustrating the process of determining microphone characteristics of a mobile device, according to embodiments as disclosed herein.

FIG. 6 is a flowchart illustrating the process of determining microphone characteristics of the microphone of a mobile device, according to embodiments as disclosed herein. The mobile device 201 communicates (601) a test audio signal to the source device 101, wherein the test audio signal may be a logarithmic test sweep signal. The source device 101 plays (602) the test audio signal using the rendering device 102. The mobile device 201 captures (603) the test signal from the rendering device 102 using the microphone 502, wherein the mobile device 201 may be placed at a very close range to the rendering device 102. The mobile device 201 then determines (604) the impulse response of the captured test signal. The mobile device 201 inverts (605) the frequency characteristics of the impulse response and determines (606) a microphone-equalizing filter, wherein the microphone-equalizing filter may be used to compensate for the frequency characteristics of the microphone 502. The controller 502 stores (607) the microphone equalizing filter in the memory 504 and may be used in the further steps. The various actions in method 600 may be performed in the order presented, in a different order or simultaneously. Further, in some embodiments, some actions listed in FIG. 6 may be omitted.

Figure 7:
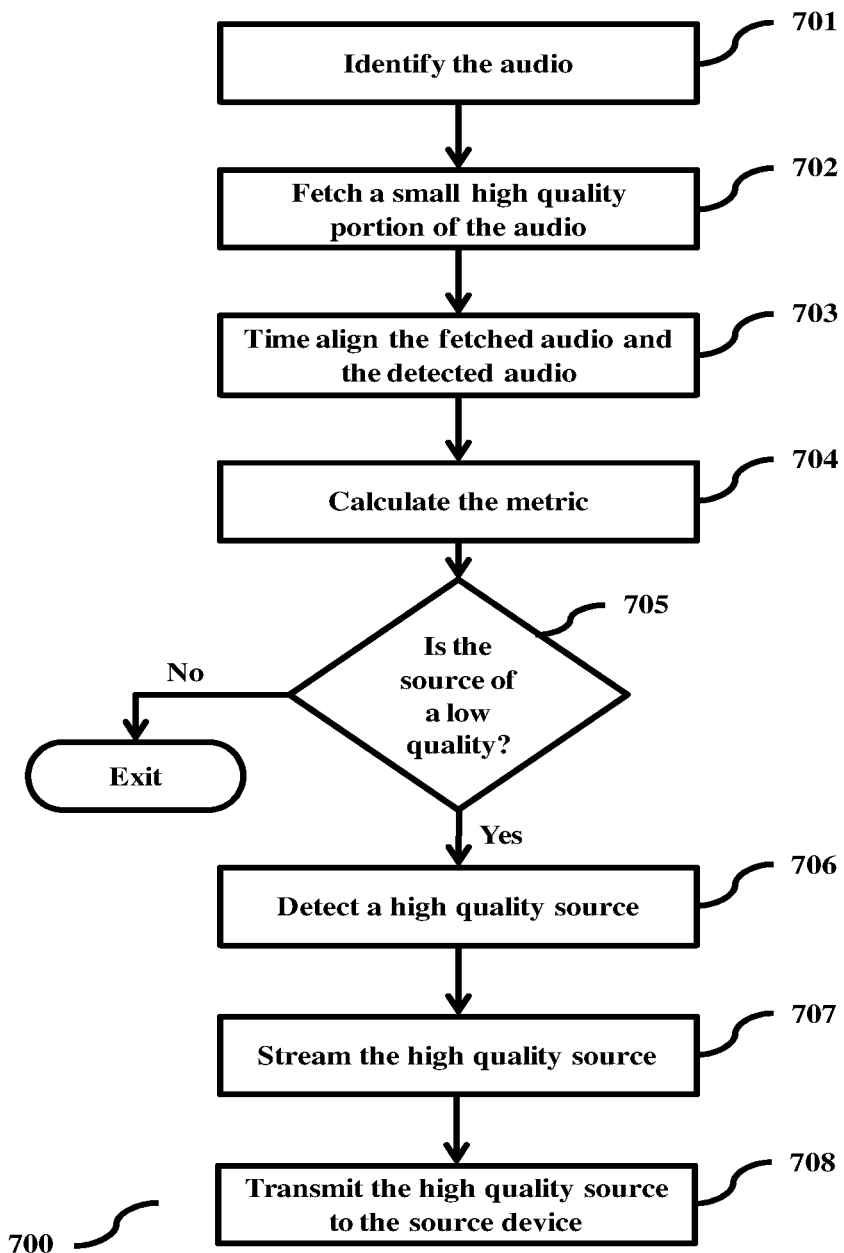
FIG. 7 is a flowchart illustrating the process of detecting quality of a source signal and improving the quality of the source signal, according to embodiments as disclosed herein.

FIG. 7 is a flowchart illustrating the process of detecting quality of a source signal and improving the quality of the source signal, according to embodiments as disclosed herein. The mobile device 201, on detecting that audio is being played though the microphone 502 identifies (701) the audio being played using the detected audio signal and a suitable audio fingerprinting means. On identifying the audio, the mobile device 201 fetches (702) a small portion of a high-quality version of the detected audio signal from a location (such as the internet, the LAN, the WAN, a dedicated server and so on). The mobile device 201 time aligns (703) the detected audio signal and the fetched audio signal by comparing the detected audio signal and time shifted versions of the fetched audio signal. Once the signals are time aligned, the mobile device 201 calculates (704) the metric related to the difference between the high-quality downloaded signal and the original source signal using the formula:

$$Sq=(H*H+O*O)/(H-O)*(H-O)$$

Where H is the fetched audio signal, O is the detected audio signal and Sq is the quality of the detected audio signal. The mobile device 201 checks (705) if the source signal is of a low quality by comparing Sq with a quality threshold. If Sq is less than the threshold, then the mobile device 201 may determine that the source signal is of low quality. If the source signal is of low quality, the mobile device 201 detects (706) a high quality source of the sound signal from a suitable location (such as the Internet, a LAN, a WAN, a dedicated server and so on) and streams (707) the high-quality signal from the suitable location. The mobile device 201 transmits (708) the difference signal between the low quality and high quality signal to the source device 101, which results in an improvement in the quality of the source signal. The various actions in method 700 may be performed in the order presented, in a different order or simultaneously. Further, in some embodiments, some actions listed in FIG. 7 may be omitted.

Figure 8A:
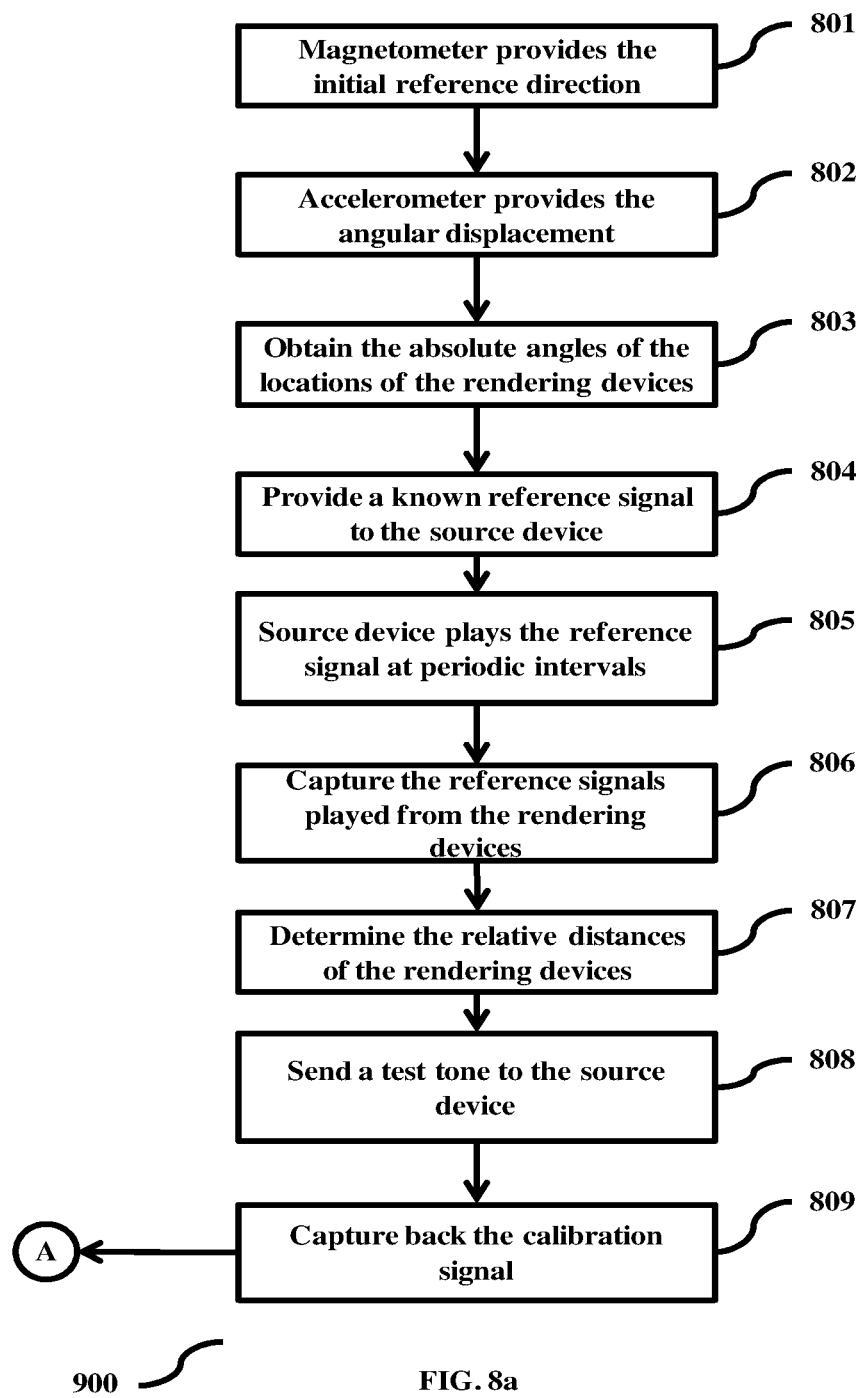
FIGS. 8a and 8b are flowcharts illustrating the process of calibrating at least one rendering device using a mobile device, according to embodiments as disclosed herein.
Figure 8B:
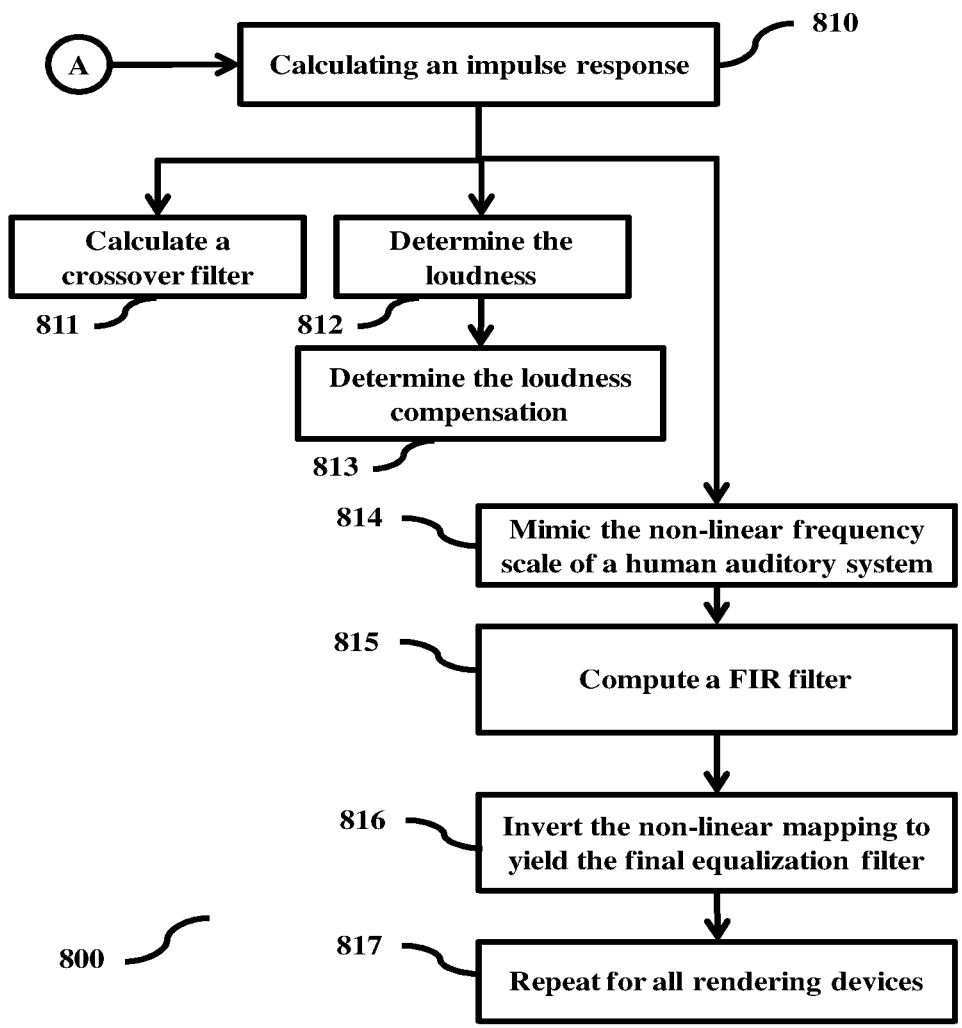

FIGS. 8a and 8b are flowcharts illustrating the process of calibrating at least one rendering device using a mobile device, according to embodiments as disclosed herein. The mobile device 201 may determine the setup of the rendering devices (number of rendering devices, locations of the rendering devices, types of rendering devices and so on). In an embodiment herein, the mobile device 201 may use the sensors of the mobile device 201 such as the magnetometer and accelerometer to measure angles with respect to the rendering devices. The magnetometer provides (801) the initial reference direction and the accelerometer provides (802) the angular displacement from the initial reference direction. The mobile device 201 obtains (803) the absolute angles of the locations of the rendering devices with respect to the reference position in terms of Cartesian coordinates. The mobile device 201 may provide instructions to the user to point the mobile device 201 toward the rendering device 102. In another embodiment herein, the mobile device 201 may prompt the user to input the coordinates of the rendering devices. In another embodiment herein, the mobile device 201 may use the microphones to triangulate and find the location of the rendering devices. The mobile device 201 determines the relative distances of the rendering devices by providing (804) a known reference signal to the source device 101. The source device 101 plays (805) the reference signal at periodic intervals (wherein the periodic intervals may be determined by the mobile device 201). The mobile device 201 captures (806) the reference signals played from the rendering devices using the microphone 502. The mobile device 201 determines (807) the relative distances of the rendering devices by calculating the delays of the captured reference signals.

The mobile device 201 may further check the acoustics of the acoustic space. The mobile device 201 uses impulse response (IR) method to find the frequency response, distance and loudness of the rendering devices and the acoustic space. The mobile device 201 first sends (808) a test tone or a calibration audio signal, preferably an audio signal frequency sweep signal, to the rendering device 102 (through the source device 101). The mobile device 201 captures (809) back the calibration signal using the microphone 502. The mobile device 201 calculates (810) an impulse response for the frequency sweep signal by taking the inverse Fourier transform (IFT) of the ratio of the FFT (Fast Fourier Transform) of the frequency sweep signal and FFT of the received microphone signal.

In one embodiment, the mobile device 201 calculates (811) a crossover filter using the impulse response, wherein the crossover filter may be applied to the rendering device 102. The cross-over filter may be a fourth order Butterworth filter, wherein the cut-off of the Butterworth filter may be determined by the mobile device 201 from the frequency response of the impulse response. In an embodiment herein, the mobile device 201 may consider the point at which the amplitude of the frequency response drops to −10 dB of the maximum amplitude over the entire frequency range as the cut-off frequency.

In another embodiment, the mobile device 201 determines (812) the loudness of the rendering device using the impulse response. The mobile device 201 may compute the loudness by calculating the energy of the impulse response. The mobile device 201 may use a well known weighting filter, such as A-weights or C-weights for computation of this loudness in conjunction with the impulse response. After determining the loudness of the rendering device, the mobile device 201 determines (813) the loudness compensation by computing the average of the magnitude of all the frequency responses for the rendering device. The mobile device 201 may use the inverse of the average of the magnitude of all the frequency responses for the rendering device to match the volume of each subsequent rendering device (if any).

In one embodiment, the mobile device 201 mimics (814) the non-linear frequency scale of a human auditory system by passing the impulse response through a set of all-pass filters. This filtered signal is hereinafter referred to as 'm'. The mobile device 201 computes (815) a finite impulse response (FIR) filter (hereinafter referred to as w), which is the minimum phase filter whose magnitude response is the inverse of m. The mobile device 201 inverts (816) the non-linear frequency scale to yield the final equalization filter by passing the FIR w through a set of all-pass filters, wherein the final equalization filter may be used to compensate the quality of rendering device. The mobile device 201 repeats (817) this process for all the rendering devices.

In an embodiment herein, the mobile device 201 may use an infinite impulse response (IIR) filter to correct the response of the rendering device. In an embodiment herein, the mobile device 201 may use a combination of FIR and IIR filters may be used to correct the response of the rendering device.

In order to synchronize multiple rendering devices in time, the mobile device 201 calculates a delay compensation by first calculating the delay between broadcast of the calibration signal from each of the rendering devices and the corresponding receipt of such signal at the microphone, preferably through examination of the point at which the impulse repulse is at its maximum. The mobile device 201 then obtains a delay compensation filter by subtracting the delay from a pre-determined maximum delay (which may be configured by the user at the source device 101). The mobile device 201 may estimate a delay filter for the subject-rendering device 102 for later compensation of any uneven timing of the previously determined impulse response.

The various actions in method 800 may be performed in the order presented, in a different order or simultaneously. Further, in some embodiments, some actions listed in FIGS. 8a and 8b may be omitted.

Figure 9:
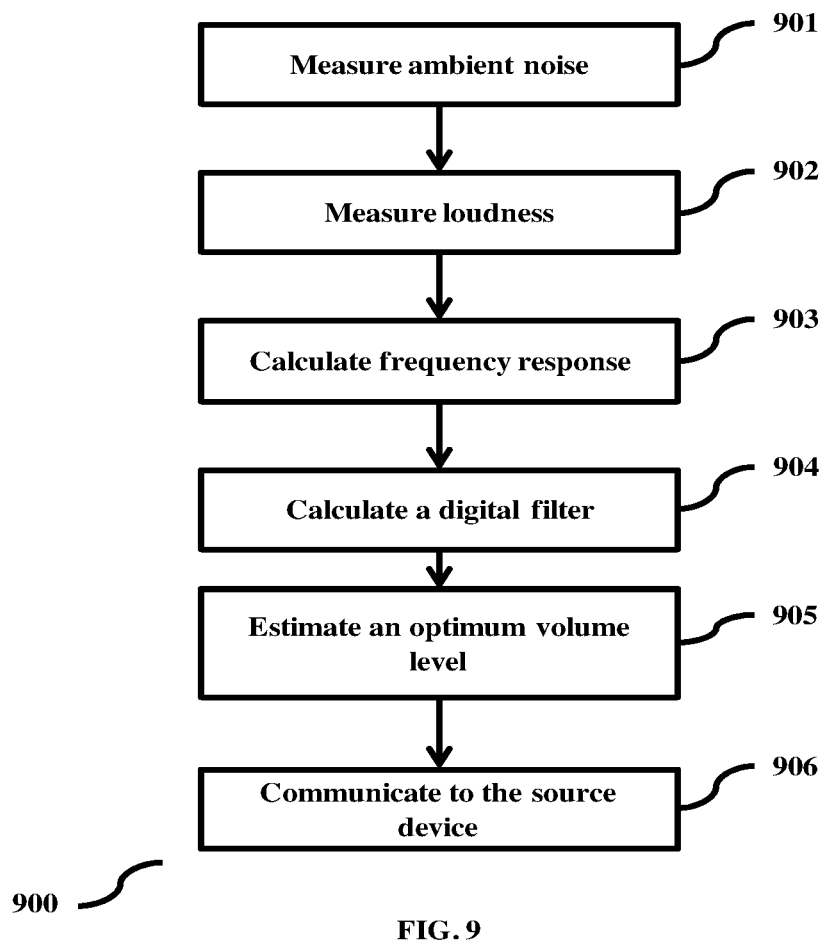
FIG. 9 is a flowchart illustrating the process of improving acoustic quality based on ambient noise, according to embodiments as disclosed herein.

FIG. 9 is a flowchart illustrating the process of improving acoustic quality based on ambient noise, according to embodiments as disclosed herein. The mobile device 201 may account for the different ambient noise levels during playback of the audio signal through the rendering devices. The mobile device 201 may use the microphone 502. On detecting a period of silence in the source signal, the mobile device 201 through the microphone 502, measures (901) ambience noise characteristics. The ambient noise characteristics may comprise of frequency characteristics and loudness level of noise, during this period of silence. The mobile device 201 measures (902) loudness using a suitable method (such as A-weights) that can mimic human hearing. The mobile device 201 calculates (903) the frequency response using the FFT of the detected noise signal. The mobile device 201 calculates (904) a digital filter (wherein the digital filter may be at least one of FIR or IIR) using the inverse of the frequency response, to compensate for the noise characteristics. The mobile device 201 also estimates (905) an optimum volume level of the source signal, based on the loudness level of the noise so as to keep constant power between the noise and the source signal. The mobile device 201 communicates (906) the digital filter and the optimum noise level to the source device 101, which performs adjustments as per the received communication. The various actions in method 900 may be performed in the order presented, in a different order or simultaneously. Further, in some embodiments, some actions listed in FIG. 9 may be omitted.

Figure 10:
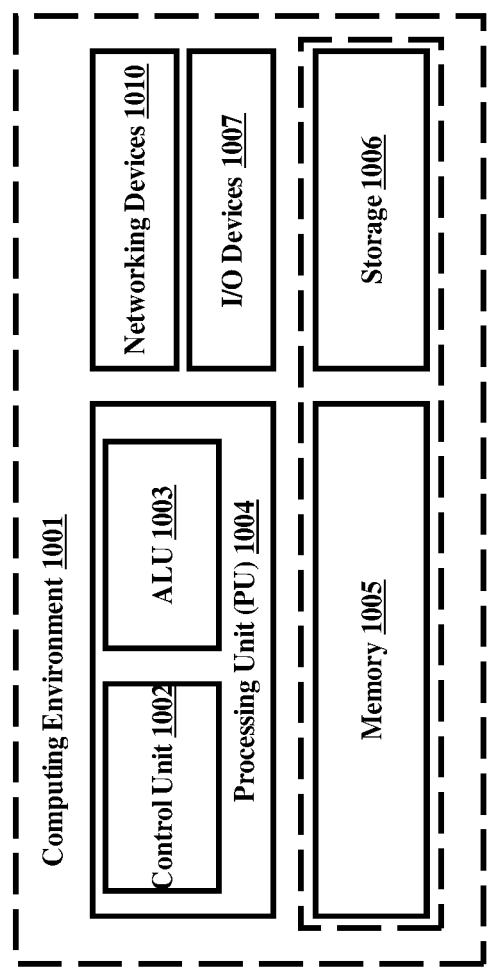
FIG. 10 illustrates a computing environment implementing the method for enhancing audio quality, according to embodiments as disclosed herein.

FIG. 10 illustrates a computing environment implementing the method for enhancing audio quality, according to embodiments as disclosed herein. As depicted the computing environment 1001 comprises at least one processing unit 1004 that is equipped with a control unit 1002 and an Arithmetic Logic Unit (ALU) 1003, a memory 1005, a storage unit 1006, plurality of networking devices 1010 and a plurality Input output (I/O) devices 1007. The processing unit 1004 is responsible for processing the instructions of the algorithm. The processing unit 1004 receives commands from the control unit in order to perform its processing. Further, any logical and arithmetic operations involved in the execution of the instructions are computed with the help of the ALU 1003.

The overall computing environment 1001 may be composed of multiple homogeneous and/or heterogeneous cores, multiple CPUs of different kinds, special media and other accelerators. The processing unit 1004 is responsible for processing the instructions of the algorithm. Further, the plurality of processing units 1004 may be located on a single chip or over multiple chips.

The algorithm comprising of instructions and codes required for the implementation are stored in either the memory unit 1005 or the storage 1006 or both. At the time of execution, the instructions may be fetched from the corresponding memory 1005 and/or storage 1006, and executed by the processing unit 1004.

In case of any hardware implementations various networking devices 1008 or external I/O devices 1007 may be connected to the computing environment to support the implementation through the networking unit and the I/O device unit.

Embodiments disclosed herein enable detection and improvement of the quality of the audio signal using a mobile device. Embodiments herein use the audio attributes such as bit rate of audio and the network link quality and along with fingerprint of audio to determine the audio quality. Since most of the audio, which is stored or streamed, is compressed using lossy compression, there may be missing portions of audio. Embodiments disclosed herein determine this loss and enhances audio by streaming the remainder portion of audio.

Embodiments disclosed herein enable an improvement in the sound quality rendered by rendering devices. By emitting the test audio signal from the source device and measuring the test audio signal using microphones, embodiments disclosed herein understand the acoustics characteristics of the rendering device. Embodiments disclosed herein then detect variation in the frequency response, loudness and timing characteristics using impulse responses and corrects for them.

Embodiments disclosed herein also compensate for the noise in the acoustic space. Using the microphone of the mobile device, embodiments disclosed herein determine the reverberation and ambient noise levels and their frequency characteristics in the acoustic space and changes the digital filters and volumes of the source signal to compensate for the varying noise levels in the acoustic space.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the claims as described herein.

EXAMPLE EMBODIMENTS

In an embodiment, method for improving audio quality of an audio system comprising of a source device and at least one rendering device using a mobile device includes improving quality of a source audio signal by the mobile device, if the quality of the source signal is below a quality threshold, wherein the source audio signal is being played on the audio system, calibrating the at least one rendering device by the mobile device, and compensating for ambient noise by the mobile device.

The method may further include obtaining frequency characteristics of at least one microphone associated with the mobile device.

The obtaining frequency characteristics of the at least one microphone associated with the mobile device may include communicating a test signal to the source device by the mobile device, capturing the test signal by the at least one microphone, on the source device playing the test signal through the rendering device, determining impulse response of the captured test signal by the mobile device, inverting frequency characteristics of the impulse response by the mobile device, determining a microphone equalizing filter by the mobile device using the impulse response and the inverted frequency characteristics of the impulse response, and using the microphone equalizing filter to compensate for frequency characteristics of the at least one microphone by the mobile device.

The determining the quality of the source audio signal by the mobile device may include identifying a detected source audio signal by the mobile device, fetching a small portion of a high quality audio signal of the identified source audio signal by the mobile device, time aligning the fetched high quality audio signal and the detected source audio signal by the mobile device, calculating a metric related to difference between the fetched high quality audio signal and the detected source audio signal using $Sq=(H*H+O*O)/(H-O)*(H-O)$, where H is the fetched high quality audio signal, O is the detected source audio signal and Sq is quality of the detected source audio signal, and comparing the metric to the quality threshold by the mobile device to determine the quality of the source audio signal.

The improving the quality of the source audio signal may include detecting a high quality source of the source audio signal by the mobile device, streaming the high quality source of the source audio signal by the mobile device, and transmitting the high quality source of the audio stream to the source device by the mobile device.

The calibrating the at least one rendering device by the mobile device may include obtaining absolute angles of location of the at least one rendering device in terms of Cartesian coordinates with respect to a reference position by the mobile device, determining relative distances of the rendering devices by the mobile device, capturing a calibration signal by the mobile device, wherein the calibration signal is sent to the rendering device by the mobile device, calculating an impulse response for the calibration signal by the mobile device, wherein the impulse response is a ratio of the FFT (Fast Fourier Transform) of the calibration signal to the FFT of the received calibration signal, calculating a crossover filter using the impulse response by the mobile device, wherein the crossover filter is a fourth order Butterworth filter, determining loudness of the rendering device using the impulse response by the mobile device, determining a loudness compensation by computing an average of magnitude of all frequency responses for the rendering device by the mobile device, and correcting response of the rendering devices by the mobile device.

The determining the relative distances of the rendering devices by the mobile device may include capturing a reference signal by the mobile device, wherein the reference signal is provided by the mobile device and is played by the source device, and determining the relative distances of the rendering devices by the mobile device by calculating delays in the captured reference signal.

The cut-off of the crossover filter may be based on the frequency response of the impulse response.

The determining loudness of the rendering device using the impulse response may include calculating energy of the impulse response.

The correcting response of the rendering devices by the mobile device may include mimicking non-linear frequency scale of a human auditory system by passing the impulse response through a set of all-pass filters by the mobile device, computing a finite impulse response (FIR) filter by the mobile device, wherein the FIR filter is a minimum phase filter whose magnitude response is inverse of the mimicked non-linear frequency scale, and inverting non-linear frequency scale to yield the final equalization filter by passing the FIR filter through a set of all-pass filters by the mobile device.

The correcting response of the rendering devices by the mobile device may include mimicking non-linear frequency scale of a human auditory system by passing the impulse response through a set of all-pass filters by the mobile device, computing a infinite impulse response (IIR) filter by the mobile device, wherein the IIR filter is a minimum phase filter whose magnitude response is inverse of the mimicked non-linear frequency scale, and inverting non-linear frequency scale to yield the final equalization filter by passing the IIR filter through a set of all-pass filters by the mobile device.

The correcting response of the rendering devices by the mobile device may include mimicking non-linear frequency scale of a human auditory system by passing the impulse response through a set of all-pass filters by the mobile device, computing a combination filter by the mobile device, wherein the combination filter is a minimum phase filter whose magnitude response is inverse of the mimicked non-linear frequency scale and the combination filter is a combination of FIR and IIR filters, and inverting non-linear frequency scale to yield the final equalization filter by passing the combination filter through a set of all-pass filters by the mobile device.

The method may further include synchronizing a plurality of rendering devices in time by calculating a delay between broadcast of the calibration signal by the mobile device, wherein the delay is the delay between broadcast of the calibration signal from each of the plurality of rendering devices and receipt of the calibration signal at the microphone, and determining a delay compensation filter by subtracting the delay from a pre-determined maximum delay by the mobile device by the mobile device.

The compensating for ambient noise by the mobile device may include measuring ambient noise characteristics by the mobile device, on the mobile device detecting a period of silence in the source audio signal, measuring loudness by the mobile device, calculating frequency response by the mobile device using FFT (Fast Fourier Transform) of the ambient noise characteristics, calculating a digital filter by the mobile device using inverse of the calculated frequency response, and estimating an optimum volume level by the mobile device based on the ambient noise characteristics.

The ambient noise characteristics may comprise of loudness level of noise and frequency characteristics.

A-weights may be used to measure loudness by the mobile device.

In another embodiment, a computer program product comprises computer executable program code recorded on a computer readable non-transitory storage medium, said computer executable program code when executed, causing a method for improving audio quality of an audio system comprising of a source device and at least one rendering device, the method including improving quality of a source audio signal, if the quality of the source signal is below a quality threshold, wherein the source audio signal is being played on the audio system, calibrating the at least one rendering device, and compensating for ambient noise.

The method may further include obtaining frequency characteristics of at least one microphone.

The obtaining frequency characteristics of the at least one microphone may include communicating a test signal to the source device, capturing the test signal by the at least one microphone, on the source device playing the test signal through the rendering device, determining impulse response of the captured test signal, inverting frequency characteristics of the impulse response, determining a microphone equalizing filter using the impulse response and the inverted frequency characteristics of the impulse response, and using the microphone equalizing filter to compensate for frequency characteristics of the at least one microphone.

The determining the quality of the source audio signal may include identifying a detected source audio signal, fetching a small portion of a high quality audio signal of the identified source audio signal, time aligning the fetched high quality audio signal and the detected source audio signal, calculating a metric by the mobile device, wherein the metric is related to difference between the fetched high quality audio signal and the detected source audio signal using $Sq=(H*H+O*O)/(H-O)*(H-O)$, where H is the fetched high quality audio signal, O is the detected source audio signal and Sq is quality of the detected source audio signal, and comparing the metric to the quality threshold to determine the quality of the source audio signal.

The improving the quality of the source audio signal may include detecting a high quality source of the source audio signal, streaming the high quality source of the source audio signal, and transmitting the high quality source of the audio stream to the source device.

The calibrating the at least one rendering device may include obtaining absolute angles of location of the at least one rendering device in terms of Cartesian coordinates with respect to a reference position, determining relative distances of the rendering devices, capturing a calibration signal, wherein the calibration signal is sent to the rendering device, calculating an impulse response for the calibration signal, wherein the impulse response is a ratio of the FFT (Fast Fourier Transform) of the calibration signal to the FFT of the received calibration signal, calculating a crossover filter using the impulse response, wherein the crossover filter is a fourth order Butterworth filter, determining loudness of the rendering device using the impulse response, determining a loudness compensation by computing an average of magnitude of all frequency responses for the rendering devicec and correcting response of the rendering devices.

The determining the relative distances of the rendering devices may include capturing a reference signal, wherein the reference signal is provided and is played by the source device, and determining the relative distances of the rendering devices by calculating delays in the captured reference signal.

The cut-off of the crossover filter may be based on the frequency response of the impulse response.

The determining loudness of the rendering device using the impulse response may comprises calculating energy of the impulse response.

The correcting response of the rendering devices may include mimicking non-linear frequency scale of a human auditory system by passing the impulse response through a set of all-pass filters, computing a finite impulse response (FIR) filter, wherein the FIR filter is a minimum phase filter whose magnitude response is inverse of the mimicked non-linear frequency scale, and inverting non-linear frequency scale to yield the final equalization filter by passing the FIR filter through a set of all-pass filters.

The correcting response of the rendering devices may include mimicking non-linear frequency scale of a human auditory system by passing the impulse response through a set of all-pass filters, computing a infinite impulse response (IIR) filter, wherein the IIR filter is a minimum phase filter whose magnitude response is inverse of the mimicked non-linear frequency scale, and inverting non-linear frequency scale to yield the final equalization filter by passing the IIR filter through a set of all-pass filters.

The correcting response of the rendering devices may include mimicking non-linear frequency scale of a human auditory system by passing the impulse response through a set of all-pass filters, computing a combination filter, wherein the combination filter is a minimum phase filter whose magnitude response is inverse of the mimicked non-linear frequency scale and the combination filter is a combination of FIR and IIR filters, and inverting non-linear frequency scale to yield the final equalization filter by passing the combination filter through a set of all-pass filters.

The method may further include synchronizing a plurality of rendering devices in time by calculating a delay between broadcast of the calibration signal, wherein the delay is the delay between broadcast of the calibration signal from each of the plurality of rendering devices and receipt of the calibration signal at the microphone, and determining a delay compensation filter by subtracting the delay from a pre-determined maximum delay.

The compensating for ambient noise may include measuring ambient noise characteristics, on the mobile device detecting a period of silence in the source audio signal, measuring loudness, calculating frequency response using FFT (Fast Fourier Transform) of the ambient noise characteristics, calculating a digital filter using inverse of the calculated frequency response, and estimating an optimum volume level based on the ambient noise characteristics.

The ambient noise characteristics may comprise of loudness level of noise and frequency characteristics.

A-weights may be used to measure loudness.

In yet another embodiment, a method for obtaining frequency characteristics of at least one microphone associated with a mobile device includes communicating a test signal to a source device by the mobile device, capturing the test signal by the at least one microphone, on the source device playing the test signal through a rendering device, determining impulse response of the captured test signal by the mobile device, inverting frequency characteristics of the impulse response by the mobile device, determining a microphone equalizing filter by the mobile device using the impulse response and the inverted frequency characteristics of the impulse response, and using the microphone equalizing filter to compensate for frequency characteristics of the at least one microphone by the mobile device.

In a further embodiment, a computer program product comprises computer executable program code recorded on a computer readable non-transitory storage medium, said computer executable program code when executed, causing a method for obtaining frequency characteristics of at least one microphone associated with the computer program product, the method including communicating a test signal to a source device, capturing the test signal by the at least one microphone, on the source device playing the test signal through a rendering device, determining impulse response of the captured test signal, inverting frequency characteristics of the impulse response, determining a microphone equalizing filter using the impulse response and the inverted frequency characteristics of the impulse response, and using the microphone equalizing filter to compensate for frequency characteristics of the at least one microphone.

In yet another embodiment, a method for improving audio quality of an audio system comprising of a source device and at least one rendering device using a mobile device by improving quality of a source audio signal by the mobile device, if the quality of the source signal is below a quality threshold, wherein the source audio signal is being played on the audio system, the method further including identifying a detected source audio signal by the mobile device, fetching a small portion of a high quality audio signal of the identified source audio signal by the mobile device, time aligning the fetched high quality audio signal and the detected source audio signal by the mobile device, calculating a metric related to difference between the fetched high quality audio signal and the detected source audio signal using $Sq=(H*H+O*O)/(H-O)*(H-O)$, where H is the fetched high quality audio signal, O is the detected source audio signal and Sq is quality of the detected source audio signal, and comparing the metric to the quality threshold by the mobile device to determine the quality of the source audio signal.

The method may further include detecting a high quality source of the source audio signal by the mobile device, streaming the high quality source of the source audio signal by the mobile device, and transmitting the high quality source of the audio stream to the source device by the mobile device.

In yet a further embodiment, a computer program product comprises computer executable program code recorded on a computer readable non-transitory storage medium, said computer executable program code when executed, causing a method for improving audio quality of an audio system comprising of a source device and at least one rendering device using a mobile device by improving quality of a source audio signal, if the quality of the source signal is below a quality threshold, wherein the source audio signal is being played on the audio system; wherein the method further includes identifying a detected source audio signal, fetching a small portion of a high quality audio signal of the identified source audio signal, time aligning the fetched high quality audio signal and the detected source audio signal, calculating a metric related to difference between the fetched high quality audio signal and the detected source audio signal using $Sq=(H*H+O*O)/(H-O)*(H-O)$, where H is the fetched high quality audio signal, O is the detected source audio signal and Sq is quality of the detected source audio signal, and comparing the metric to the quality threshold to determine the quality of the source audio signal.

The method may further include detecting a high quality source of the source audio signal, streaming the high quality source of the source audio signal, and transmitting the high quality source of the audio stream to the source device.

In a further embodiment, a method for improving audio quality of an audio system comprising of a source device and at least one rendering device using a mobile device by calibrating the at least one rendering device by the mobile device includes obtaining absolute angles of location of the at least one rendering device in terms of Cartesian coordinates with respect to a reference position by the mobile device, determining relative distances of the rendering devices by the mobile device, capturing a calibration signal by the mobile device, wherein the calibration signal is sent to the rendering device by the mobile device, calculating an impulse response for the calibration signal by the mobile device, wherein the impulse response is a ratio of the FFT (Fast Fourier Transform) of the calibration signal to the FFT of the received calibration signal, calculating a crossover filter using the impulse response by the mobile device, wherein the crossover filter is a fourth order Butterworth filter, determining loudness of the rendering device using the impulse response by the mobile device, determining a loudness compensation by computing an average of magnitude of all frequency responses for the rendering device by the mobile device, and correcting response of the rendering devices by the mobile device.

The determining the relative distances of the rendering devices by the mobile device may include capturing a reference signal by the mobile device, wherein the reference signal is provided by the mobile device and is played by the source device, and determining the relative distances of the rendering devices by the mobile device by calculating delays in the captured reference signal.

The cut-off of the crossover filter may be based on the frequency response of the impulse response.

The determining loudness of the rendering device using the impulse response may comprise of calculating energy of the impulse response.

The correcting response of the rendering devices by the mobile device may include mimicking non-linear frequency scale of a human auditory system by passing the impulse response through a set of all-pass filters by the mobile device, computing a finite impulse response (FIR) filter by the mobile device, wherein the FIR filter is a minimum phase filter whose magnitude response is inverse of the mimicked non-linear frequency scale, and inverting non-linear frequency scale to yield the final equalization filter by passing the FIR filter through a set of all-pass filters by the mobile device.

The correcting response of the rendering devices by the mobile device may include mimicking non-linear frequency scale of a human auditory system by passing the impulse response through a set of all-pass filters by the mobile device, computing a infinite impulse response (IIR) filter by the mobile device, wherein the IIR filter is a minimum phase filter whose magnitude response is inverse of the mimicked non-linear frequency scale, and inverting non-linear frequency scale to yield the final equalization filter by passing the IIR filter through a set of all-pass filters by the mobile device.

The correcting response of the rendering devices by the mobile device may include mimicking non-linear frequency scale of a human auditory system by passing the impulse response through a set of all-pass filters by the mobile device, computing a combination filter by the mobile device, wherein the combination filter is a minimum phase filter whose magnitude response is inverse of the mimicked non-linear frequency scale and the combination filter is a combination of FIR and IIR filters, and inverting non-linear frequency scale to yield the final equalization filter by passing the combination filter through a set of all-pass filters by the mobile device.

The method may further include synchronizing a plurality of rendering devices in time by calculating a delay between broadcast of the calibration signal by the mobile device, wherein the delay is the delay between broadcast of the calibration signal from each of the plurality of rendering devices and receipt of the calibration signal at the microphone, and determining a delay compensation filter by subtracting the delay from a pre-determined maximum delay by the mobile device by the mobile device.

In yet a further embodiment, a computer program product comprises computer executable program code recorded on a computer readable non-transitory storage medium, said computer executable program code when executed, causing a method for improving audio quality of an audio system comprising of a source device and at least one rendering device by calibrating the at least one rendering device; wherein the method further includes obtaining absolute angles of location of the at least one rendering device in terms of Cartesian coordinates with respect to a reference position, determining relative distances of the rendering devices, capturing a calibration signal, wherein the calibration signal is sent to the rendering device, calculating an impulse response for the calibration signal, wherein the impulse response is a ratio of the FFT (Fast Fourier Transform) of the calibration signal to the FFT of the received calibration signal, calculating a crossover filter using the impulse response, wherein the crossover filter is a fourth order Butterworth filter, determining loudness of the rendering device using the impulse response, determining a loudness compensation by computing an average of magnitude of all frequency responses for the rendering device, and correcting response of the rendering devices.

The determining the relative distances of the rendering devices may include capturing a reference signal, wherein the reference signal is provided and is played by the source device, and determining the relative distances of the rendering devices by calculating delays in the captured reference signal.

The cut-off of the crossover filter may be based on the frequency response of the impulse response.

The determining loudness of the rendering device using the impulse response may comprise of calculating energy of the impulse response.

The correcting response of the rendering devices may include mimicking non-linear frequency scale of a human auditory system by passing the impulse response through a set of all-pass filters, computing a finite impulse response (FIR) filter, wherein the FIR filter is a minimum phase filter whose magnitude response is inverse of the mimicked non-linear frequency scale, and inverting non-linear frequency scale to yield the final equalization filter by passing the FIR filter through a set of all-pass filters.

The correcting response of the rendering devices may include mimicking non-linear frequency scale of a human auditory system by passing the impulse response through a set of all-pass filters, computing a infinite impulse response (IIR) filter, wherein the IIR filter is a minimum phase filter whose magnitude response is inverse of the mimicked non-linear frequency scale, and inverting non-linear frequency scale to yield the final equalization filter by passing the IIR filter through a set of all-pass filters.

The correcting response of the rendering devices may include mimicking non-linear frequency scale of a human auditory system by passing the impulse response through a set of all-pass filters, computing a combination filter, wherein the combination filter is a minimum phase filter whose magnitude response is inverse of the mimicked non-linear frequency scale and the combination filter is a combination of FIR and IIR filters, and inverting non-linear frequency scale to yield the final equalization filter by passing the combination filter through a set of all-pass filters.

The method may further include synchronizing a plurality of rendering devices in time by calculating a delay between broadcast of the calibration signal, wherein the delay is the delay between broadcast of the calibration signal from each of the plurality of rendering devices and receipt of the calibration signal at the microphone, and determining a delay compensation filter by subtracting the delay from a pre-determined maximum delay.

In a further embodiment, a method for improving audio quality of an audio system comprising of a source device and at least one rendering device using a mobile device by compensating for ambient noise includes measuring ambient noise characteristics by the mobile device, on the mobile device detecting a period of silence in the source audio signal, measuring loudness by the mobile device, calculating frequency response by the mobile device using FFT (Fast Fourier Transform) of the ambient noise characteristics, calculating a digital filter by the mobile device using inverse of the calculated frequency response, and estimating an optimum volume level by the mobile device based on the ambient noise characteristics.

The ambient noise characteristics may comprise of loudness level of noise and frequency characteristics.

A-weights may be used to measure loudness by the mobile device.

In a further embodiment, a computer program product comprises computer executable program code recorded on a computer readable non-transitory storage medium, said computer executable program code when executed, causing a method for improving audio quality of an audio system comprising of a source device and at least one rendering device by compensating for ambient noise; wherein the method further comprises of measuring ambient noise characteristics, on detecting a period of silence in the source audio signal, measuring loudness, calculating frequency response using FFT (Fast Fourier Transform) of the ambient noise characteristics, calculating a digital filter using inverse of the calculated frequency response, and estimating an optimum volume level based on the ambient noise characteristics.

The ambient noise characteristics may comprise of loudness level of noise and frequency characteristics.

A-weights may be used to measure loudness.

What is claimed is:

1. A method, performed by a mobile device, for obtaining a high quality version of a first audio signal that is generated by a first audio source and is being played back on an audio system that includes a source device and at least one rendering device, the method comprising:
   identifying the first audio signal;
   determining whether a quality of the first audio signal is below a quality threshold, said determining comprising:

obtaining a portion of a second audio signal having a higher quality than the first audio signal from a second audio source;

time aligning the obtained portion of the second audio signal and the identified first audio signal; and calculating a metric based on a difference between the obtained portion of the second audio signal and the identified first audio signal, wherein the metric is calculated in accordance with:

$$Sq=(H*H+O*O)/(H-O)*(H-O)$$

where H is the obtained portion of the second audio signal, O is the identified first audio signal and Sq is the quality of the identified first audio signal; and in response to determining that the quality of the first audio signal is below the quality threshold, providing a location of the second audio source or a portion of the second audio signal to the source device for streaming thereby.

2. The method of claim 1, wherein the identifying the first audio signal comprises:

detecting the first audio signal by at least one microphone; and identifying the first audio signal based on audio fingerprinting.

3. The method of claim 1, wherein the location is remote with respect to the source device and the mobile device.

4. The method of claim 1, wherein the mobile device and the source device are the same device.

5. The method of claim 1, further comprising:

streaming the portion of the second audio signal from the location.

6. The method of claim 1, wherein the second audio source is a server coupled to the mobile device via a network.

7. The method of claim 1, wherein the mobile device is a mobile phone.

8. A computer program product comprising computer executable program code recorded on a computer readable non-transitory storage medium, said computer executable program code when executed, performing a method for obtaining a high quality version of a first audio signal that is generated by a first audio source and is being played back on an audio system that includes a source device and at least one rendering device, the method comprising:

identifying the first audio signal;

determining whether a quality of the first audio signal is below a quality threshold, wherein said determining comprises:

obtaining a portion of a second audio signal having a higher quality than the first audio signal from a second audio source;

time aligning the obtained portion of the second audio signal and the identified first audio signal;

calculating a metric based on a difference between the obtained portion of the second audio signal and the identified first audio signal, wherein the metric is calculated in accordance with:

$$Sq=(H*H+O*O)/(H-O)*(H-O)$$

where H is the obtained portion of the second audio signal, O is the identified first audio signal and Sq is the quality of the identified first audio signal; and in response to determining that the quality of the first audio signal is below the quality threshold, providing a location of the second audio source or a portion of the second audio signal to the source device.

9. The computer program product of claim 8, wherein the identifying the first audio signal comprises:

detecting the first audio signal by at least one microphone; and identifying the first audio signal based on audio fingerprinting.

10. The computer program product of claim 8, wherein the at least one microphone is included in a mobile device.

11. The computer program product of claim 10, wherein the second audio source is a server coupled to at least mobile device via a network.

12. The computer program product of claim 10, wherein the mobile device is a mobile phone.

13. The computer program product of claim 8, wherein the location is remote with respect to the source device and the mobile device.

14. The computer program product of claim 8, wherein the method further comprises streaming the portion of the second audio signal from the location.

15. A mobile device configured to obtain a high quality version of a first audio signal, comprising:

at least one microphone configured to detect the first audio signal that is generated by a first audio source and is being played back by at least one rendering device coupled to a source device; and a processing unit configured to:

identify the first audio signal;

determine whether a quality of the first audio signal is below a quality threshold, wherein said processing unit is configured to determine whether the quality of the first audio signal is below a quality threshold by:

obtaining a portion of a second audio signal having a higher quality than the first audio signal from a second audio source;

time aligning the obtained portion of the second audio signal and the identified first audio signal;

calculating a metric based on a difference between the obtained portion of the second audio signal and the identified first audio signal, wherein the metric is calculated in accordance with:

$$Sq=(H*H+O*O)/(H-O)*(H-O)$$

where H is the obtained portion of the second audio signal, O is the identified first audio signal and Sq is the quality of the identified first audio signal; and in response to a determination that the quality of the first audio signal is below the quality threshold, provide a location of the second audio source or a portion of the second audio signal to the source device.

16. The mobile device of claim 15, wherein the processing unit is configured to identify the first audio signal based on audio fingerprinting.

17. The mobile device of claim 15, wherein the location is remote with respect to the source device and the mobile device.

18. The mobile device of claim 15, wherein the processing unit is further configured to stream the portion of the second audio signal from the location.

19. The mobile device of claim 15, wherein the second audio source is a server coupled to the mobile device via a network.

20. The mobile device of claim 15, wherein the mobile device is a mobile phone.

* * * * *